US010927000B2

(12) United States Patent
Chen et al.

(10) Patent No.: US 10,927,000 B2
(45) Date of Patent: Feb. 23, 2021

(54) MEMS STRUCTURE WITH AN ETCH STOP LAYER BURIED WITHIN INTER-DIELECTRIC LAYER

(71) Applicant: UNITED MICROELECTRONICS CORP., Hsin-Chu (TW)

(72) Inventors: Li-Che Chen, Pingtung County (TW); Te-Yuan Wu, Hsinchu (TW); Chia-Huei Lin, New Taipei (TW); Hui-Min Wu, Hsinchu County (TW); Kun-Che Hsieh, Tainan (TW); Kuan-Yu Wang, New Taipei (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 282 days.

(21) Appl. No.: 15/295,997

(22) Filed: Oct. 17, 2016

(65) Prior Publication Data

US 2017/0036905 A1 Feb. 9, 2017

Related U.S. Application Data

(62) Division of application No. 13/917,655, filed on Jun. 14, 2013, now Pat. No. 9,499,399.

(51) Int. Cl.
*B81B 3/00* (2006.01)
*B81C 1/00* (2006.01)

(52) U.S. Cl.
CPC ........ *B81B 3/0075* (2013.01); *B81C 1/00555* (2013.01); *B81C 1/00563* (2013.01); *B81C 1/00587* (2013.01); *B81C 1/00595* (2013.01); *B81C 1/00801* (2013.01); *B81B 2201/0264* (2013.01); *B81B 2203/0127* (2013.01); *B81B 2207/07* (2013.01); *B81C 1/00246* (2013.01); *B81C 2201/014* (2013.01); *B81C 2203/0714* (2013.01); *B81C 2203/0735* (2013.01)

(58) Field of Classification Search
CPC .... B81B 2203/0127; B81B 2201/0264; B81C 1/00555; B81C 1/00563; B81C 1/00587; B81C 1/00595; B81C 1/00801; B81C 2201/014

See application file for complete search history.

(56) References Cited

U.S. PATENT DOCUMENTS

| 7,759,256 B2 | 7/2010 | Wang |
| 8,258,591 B2 | 9/2012 | Lee |
| 8,878,367 B2 | 11/2014 | Lin |
| 2009/0166772 A1* | 7/2009 | Hsieh ................. B81C 1/00182 257/415 |
| 2009/0179233 A1* | 7/2009 | Lee .................... B81C 1/00246 257/254 |
| 2010/0074458 A1 | 3/2010 | Lan |
| 2011/0057288 A1 | 3/2011 | Tan |

(Continued)

*Primary Examiner* — Marcos D. Pizarro
(74) *Attorney, Agent, or Firm* — Winston Hsu

(57) ABSTRACT

A MEMS structure includes a substrate, an inter-dielectric layer on a front side of the substrate, a MEMS component on the inter-dielectric layer, and a chamber disposed within the inter-dielectric layer and through the substrate. The chamber has an opening at a backside of the substrate. An etch stop layer is disposed within the inter-dielectric layer. The chamber has a ceiling opposite to the opening and a sidewall joining the ceiling. The sidewall includes a portion of the etch stop layer.

7 Claims, 8 Drawing Sheets

(56) References Cited

U.S. PATENT DOCUMENTS

2013/0062713 A1    3/2013  Sakuragi
2014/0264662 A1*   9/2014  Cheng ................. B81C 1/00309
                                                              257/419

* cited by examiner

MEMS STRUCTURE WITH AN ETCH STOP LAYER BURIED WITHIN INTER-DIELECTRIC LAYER

CROSS REFERENCE TO RELATED APPLICATIONS

This application is a division of U.S. application Ser. No. 13/917,655 filed Jun. 14, 2013, and incorporated herein by reference in its entirety.

BACKGROUND OF THE INVENTION

1. Field of the Invention

The present invention relates to a microelectromechanical system (MEMS) technology, and particularly relates to a MEMS structure and a method of fabricating such MEMS structure.

2. Description of the Prior Art

MEMS devices can be applied in many applications, such as accelerometer, gyro sensor, flow meter, microphone, micro-speaker, and so on, and serves as microsensors, microactuators, and so on, operating based on, for example, electromagnetic, electrostrictive, thermoelectric, piezoelectric, or piezoresistive effects. It is preferred that the method for making an MEMS device is compatible with a standard CMOS manufacturing process.

Currently, a MEMS pressure sensing device is made in the way to allow the substrate to have an opening from backside and form a chamber on the inter-dielectric layers by dry or wet etch process. However, the MEMS diaphragm is directly used as an oxide etch stop without using other extra etch stop layer and may be damaged during the etch. Therefore, there is still a need for a novel method to form a MEMS device.

SUMMARY OF THE INVENTION

One objective of the present invention is to provide a method of forming a MEMS structure, and in which a MEMS component, such as MEMS diaphragm, will be not damaged during an etch process for forming an opening from backside of the substrate.

According to an embodiment of the present invention, a method of forming a MEMS structure includes steps as follows. A metal structure and an inter-dielectric layer are formed on a front side of a substrate. An etch stop layer is formed to be buried within the inter-dielectric layer. A MEMS component is formed on the inter-dielectric layer. The backside of the substrate is ground. The substrate and the inter-dielectric layer is etched and the etch is allowed to stop at the etch stop layer, so as to form a chamber.

According to another embodiment of the present invention, a MEMS structure includes a substrate, an inter-dielectric layer on a front side of the substrate, a MEMS component on the inter-dielectric layer, and a chamber disposed within the inter-dielectric layer and through the substrate. The chamber has an opening at a backside of the substrate. An etch stop layer is disposed within the inter-dielectric layer. The chamber has a ceiling opposite to the opening and a sidewall joining the ceiling. The sidewall includes a portion of the etch stop layer.

In the method according to the present invention, an etch stop layer is formed to be buried within the inter-dielectric layer, such that when the substrate and the inter-dielectric layer are etched in order to form a chamber, the etch is allowed to stop at the etch stop layer. Accordingly, the MEMS structure is prevented from the risk of being damaged by etching, and a process window or performance can be improved.

These and other objectives of the present invention will no doubt become obvious to those of ordinary skill in the art after reading the following detailed description of the preferred embodiment that is illustrated in the various figures and drawings.

DETAILED DESCRIPTION

Some embodiments or modifications according to the present invention will be further described hereinafter. For conciseness and easy comparison among the embodiments or modifications, the same elements will be denoted with the same referral numbers or symbols, and the same contents may be not described again.

Figure 1:
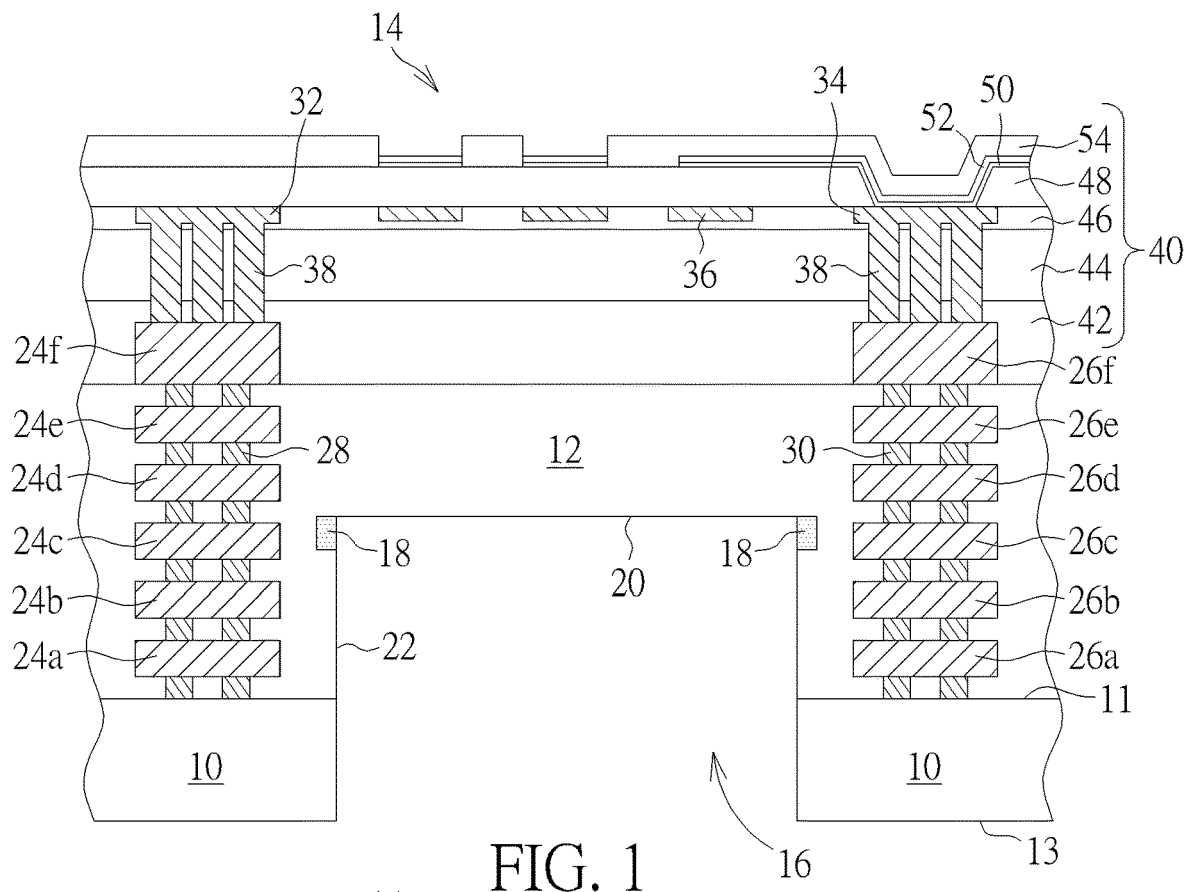
FIG. 1 is a cross-sectional view illustrating a structure including a MEMS structure according to an embodiment of the present invention.

Referring to FIG. 1, a MEMS structure according to a first embodiment of the present invention includes a substrate 10, an inter-dielectric layer 12 on a front side 11 of the substrate 10, a MEMS component 14 on the inter-dielectric layer 12, and a chamber 16 disposed within the inter-dielectric layer 12 and through the substrate 10. The inter-dielectric layer 12 represents a collection of all dielectric layers between the substrate 10 and the MEMS component 14. A certain thickness of inter-dielectric layer 12 remains between the MEMS component 14 and the chamber 16. The chamber 16 has an opening at a backside 13 of the substrate 10. An etch stop layer 18 is disposed within the inter-dielectric layer 12. It is preferred that an etch selectivity of the inter-dielectric layer 12 to the etch stop layer 18 is greater than 1. The chamber 16 has a ceiling 20 opposite to the opening and a sidewall 22 joining the ceiling 20. The sidewall 22 may further include a portion of the etch stop layer 18.

The MEMS structure may further include a metal structure in the inter-dielectric layer 12. The metal structure may serve as for example a metal interconnect structure or a shielding structure for preventing the protected elements from being etched, but not limited thereto. In FIG. 1, the metal structure may include a plurality of metal layers and a plurality of vias connecting the metal layers. The metal layers may include, for example, bottom layers 24a and 26a, a plurality of intermediate layers 24b, 24c, 24d, 24e, 26b, 26c, 26d and 26e, and top layers 24f and 26f. The vias may include, for example, vias 28 and vias 30. When the metal structure serves as a metal interconnect structure which may include layers Metal-1 to Metal-6 and be located in a CMOS region, i.e. a logic region.

Types of the MEMS component to be formed are not particularly limited in the present invention, whereas people skilled in the art should be able to embody the invention based on the illustration to obtain desirable devices. For illustration purposes, as shown in FIG. 1, the MEMS component 14 may include electrodes and diaphragms for a micro-flow meter. Metal layers 32 and 34 and a plurality of metal layers 36 are each formed within a trench in a dielectric layer 40 which may include dielectric layers 42, 44, 46, 48 and 54, and a plurality of vias 38 connect the metal layers 32 and 34 and the top layers 24f and 26f respectively. The dielectric layer 40 also may serve as a passivation layer for protecting underlying conductive metal layers. The dielectric layer 48 covers the metal layers 32, 34, and 36 and has an opening exposing the metal layer 34. A barrier layer 50 is formed on the dielectric layer 48 and the metal layer 34 where it is exposed from the opening. A metal layer 52 is formed on the barrier layer 50 and patterned for serving as electrodes. When the metal layer 52 includes tungsten or platinum, the barrier layer 50 may preferably include tantalum nitride (TaN). The barrier layer 50 may also serve as an adhesion layer to improve the adhesion of the metal layer 52 to the dielectric layer 48. The dielectric layer 54 covers the metal layer 52 and the barrier layer 50 and exposes some electrodes played by the metal layer 52.

In other embodiment, the MEMS component 14 may include a metal diaphragm 36 for storing charges.

Figure 2:
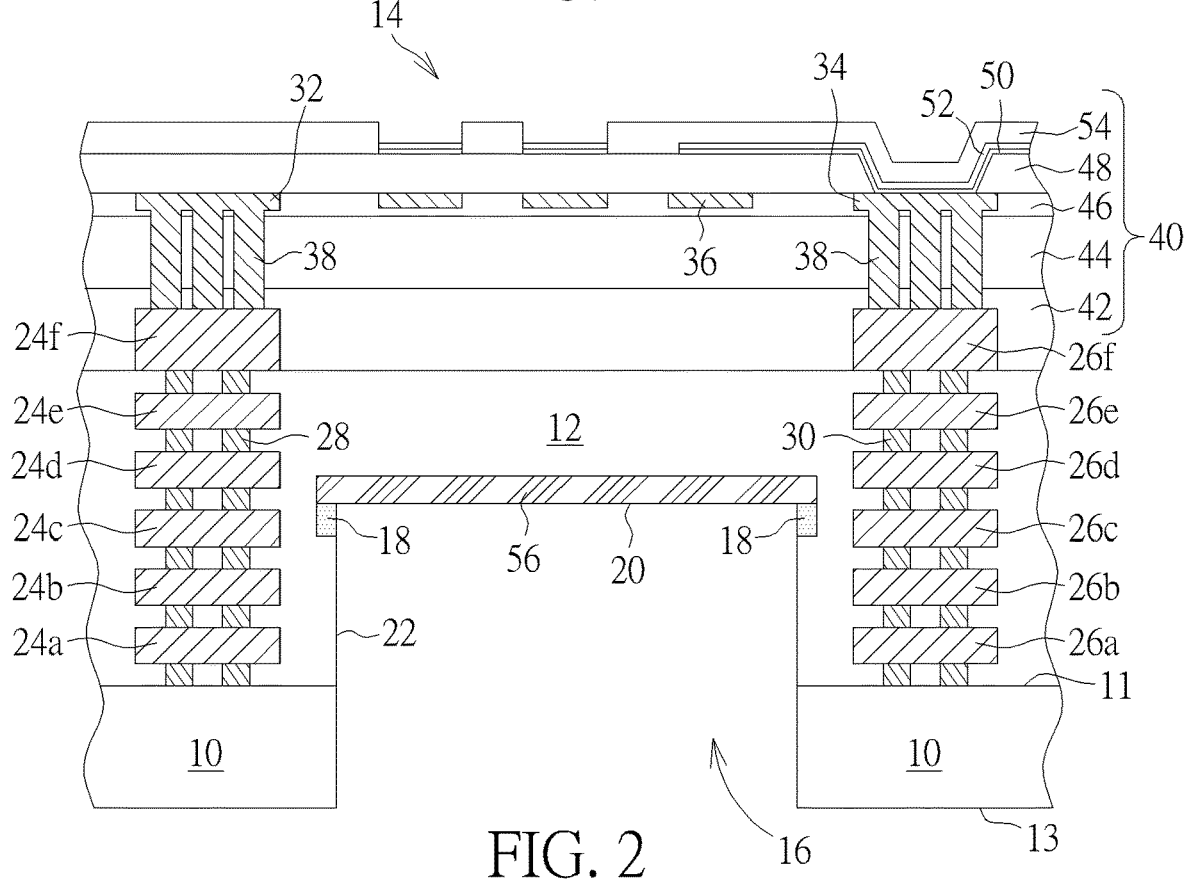
FIG. 2 is a cross-sectional view illustrating a structure including a MEMS structure according to another embodiment of the present invention.

FIG. 2 illustrates a MEMS structure according to a second embodiment of the present invention. The difference is that in the second embodiment an additional dielectric layer 56, but not limited to only one, serving as another etch stop layer is further included. The dielectric layer 56 is disposed on the etch stop layer 18 within the inter-dielectric layer 12. The etch stop layer 18 is etch-selective to the dielectric layer 56. For example, an etch selectivity of the etch stop layer 18 to the dielectric layer 56 is greater than 1. For example, the etch stop layer 18 may include material such as amorphous silicon or poly-silicon. And, the dielectric layer 56 may include material such as silicon nitride or silicon carbide. Accordingly, when the etch stop layer 18 is etched to be removed, the dielectric layer 56 can protect the inter-dielectric layer 12 during the etch process.

Figure 3:
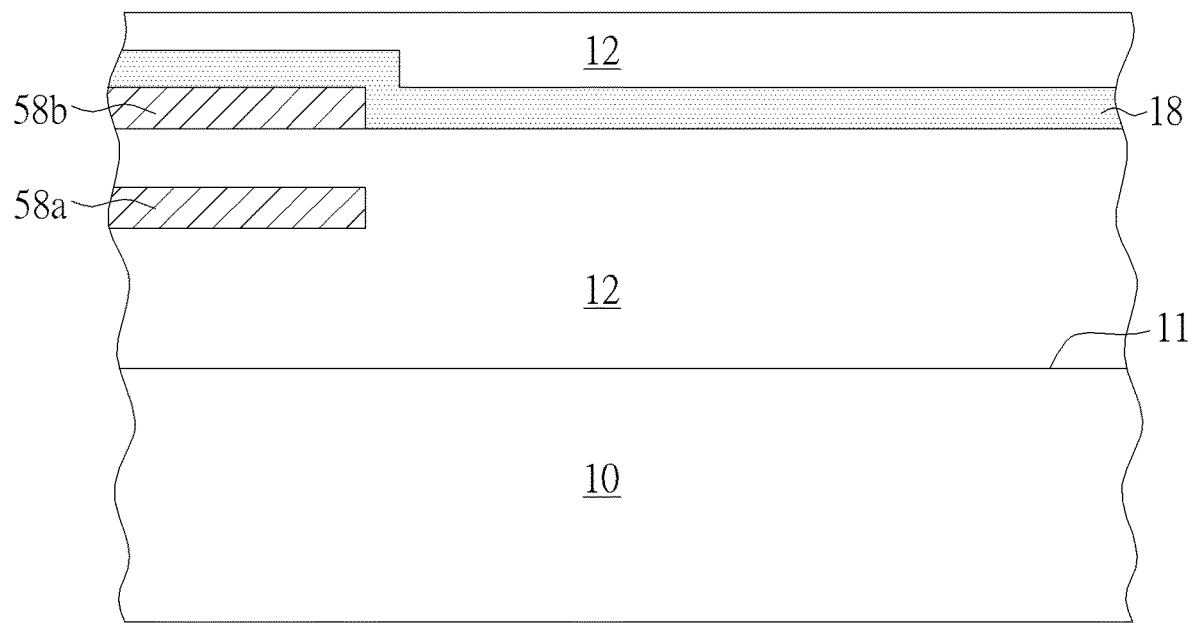
FIGS. 3-7 are cross-sectional views illustrating a method of forming a MEMS structure according to an embodiment of the present invention.

FIGS. 3-7 depict a method of forming a MEMS structure according to an embodiment of the present invention. Referring to FIG. 3, a metal interconnect structure including a metal layers 58a and 58b and an inter-dielectric layer 12 are formed on a front side 11 of a substrate 10. The substrate 10 may be a semiconductor substrate, for example, a silicon substrate with a thickness of for example about 725 µm. The inter-dielectric layer 12 may have a thickness of, for example, 30,000 to 50,000 angstroms. An etch stop layer 18 is formed to be buried within the inter-dielectric layer 12. It may be achieved by performing for example a CVD process or sputtering process or other process and patterning. The etch stop layer 18 may have a thickness of for example about 5,000 angstroms (less than 10,000 angstroms). A MEMS component (not shown) is formed on the inter-dielectric layer 12. The inter-dielectric layer 12 may be formed in a way to include a plurality of layers containing same or different dielectric materials for allowing the metal layers 58a and 58b and the etch stop layer 18 to be formed respectively therebetween. The etch stop layer 18 may be preferably disposed between the substrate 10 and the top metal layer of the metal structure within the inter-dielectric layer 12 and may or may not extend onto an intermediate layer of the metal structure between the top layer of the metal structure and the substrate 10. For example, the intermediate layer may be a Metal-3 or Metal-4 of a metal interconnect structure. The metal interconnect structure may be formed using a damascene process. In one embodiment, the metal layers 58a and 58b may include aluminum and the vias (not shown) may include tungsten, but be not limited thereto. As shown by FIG. 3, the etch stop layer 18 is formed to extend onto the metal layer 58a or 58b, but not limited thereto.

Figure 4:
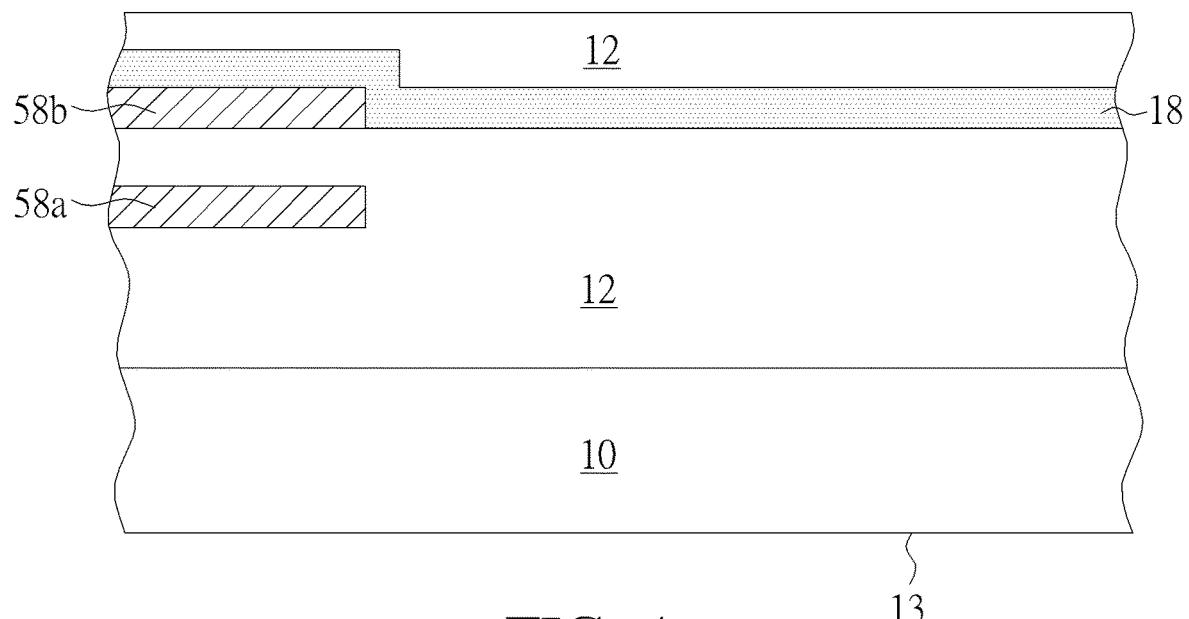

Thereafter, as shown in FIG. 4, the backside 13 of the substrate 10 is ground using for example a backside grinding process until a desired thickness, for example about 400 µm, is achieved.

Figure 5:
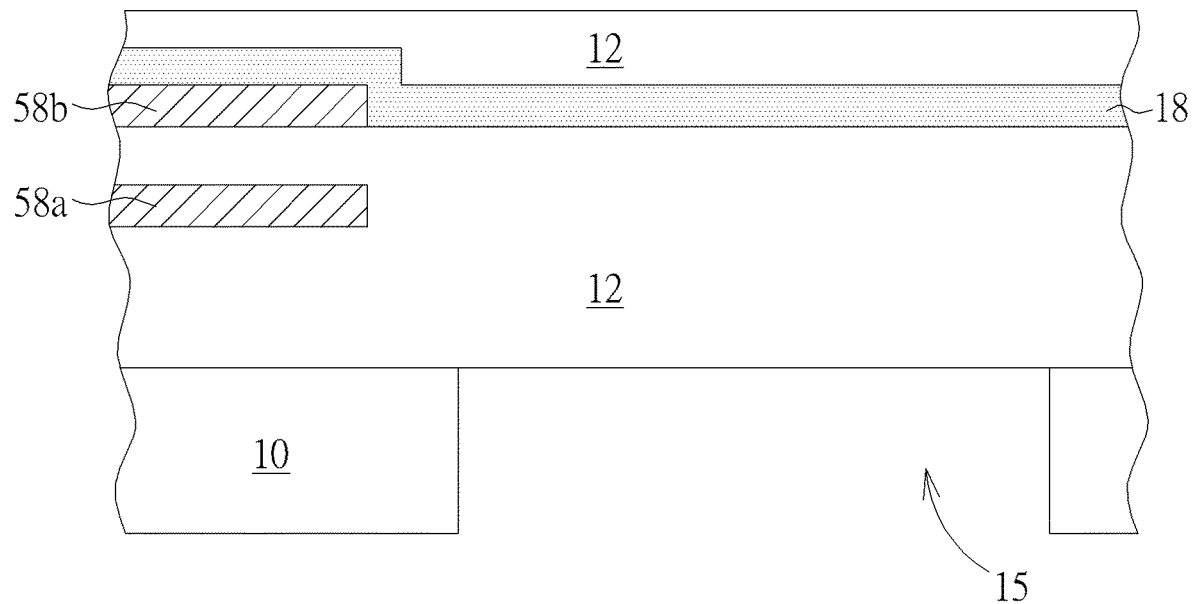

Thereafter, the substrate 10 and the inter-dielectric layer 12 are etched. As shown in FIG. 5, the substrate 10 may be etched through a hard mask (not shown) formed on the substrate 10 to expose a predetermined area to form an opening 15. The hard mask may include an oxide layer having a thickness of about 20,000 angstroms. The substrate 10 is etch-selective to the hard mask in the etch process. The etch process may include a reaction ion etch (RIE) process, which is dry and anisotropic, but be not limited thereto.

Figure 6:
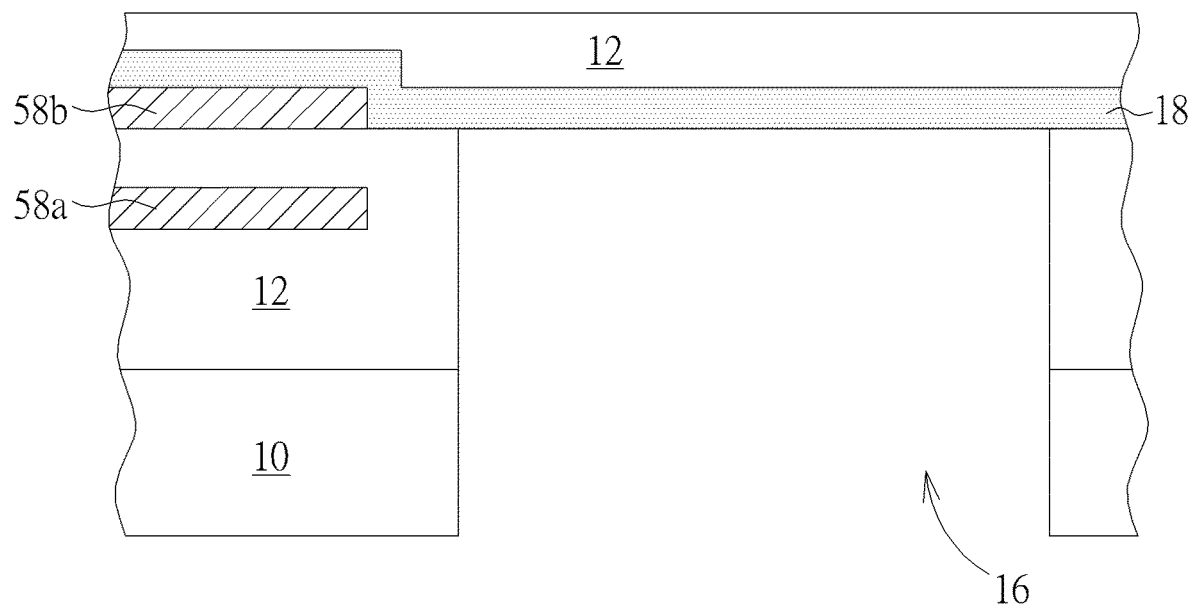

As shown in FIG. 6, the inter-dielectric layer 12 may be subsequently etched employing a same etching chamber (previously employed for etching the substrate 10) through the opening 15 of the substrate 10 to form a chamber 16. The inter-dielectric layer 12 is allowed to be etch-selective to the etch stop layer 18 in the etch process. Accordingly, the etch can stop at the etch stop layer 18, so as to form the chamber 16. The hard mask formed of oxide may be etched away during the etch for the inter-dielectric layer 12. The etch process may include an RIE process, but be not limited thereto.

Figure 7:
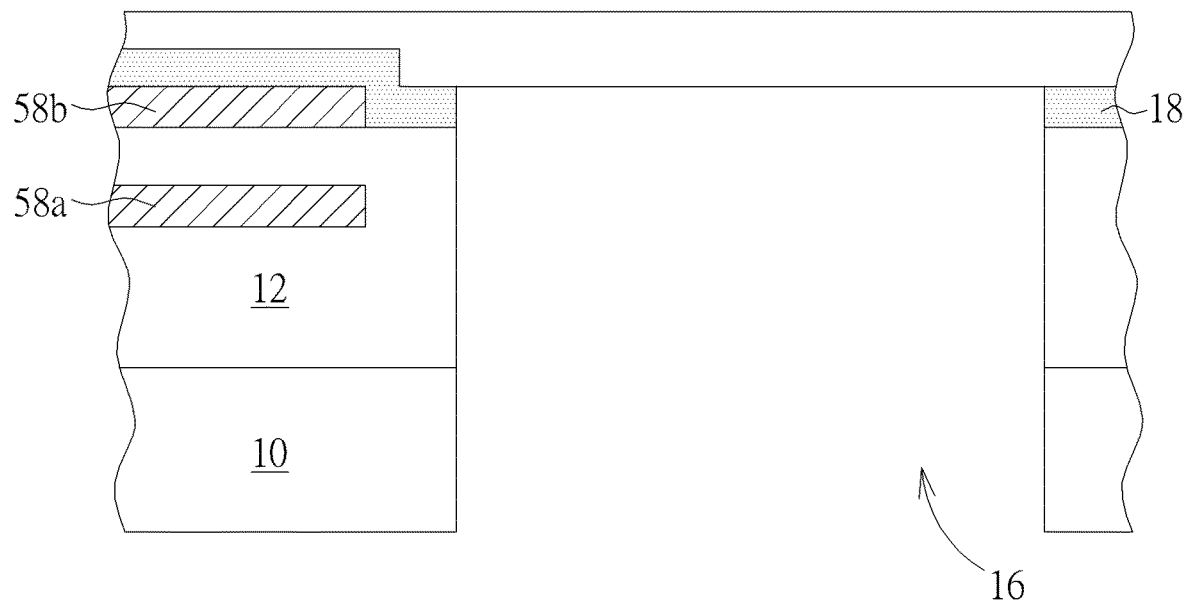

For a better MEMS device performance, the etch stop layer 18 may be further etched to be partially removed as shown in FIG. 7. In this step, the etch stop layer 18 should be etch-selective to the inter-dielectric layer 12 in the etch process. As a result, the remaining dielectric layer 18 may be in a frame shape surrounding the upper portion of the chamber 16. The etch may include an RIE process, but be not limited thereto.

Figure 8:
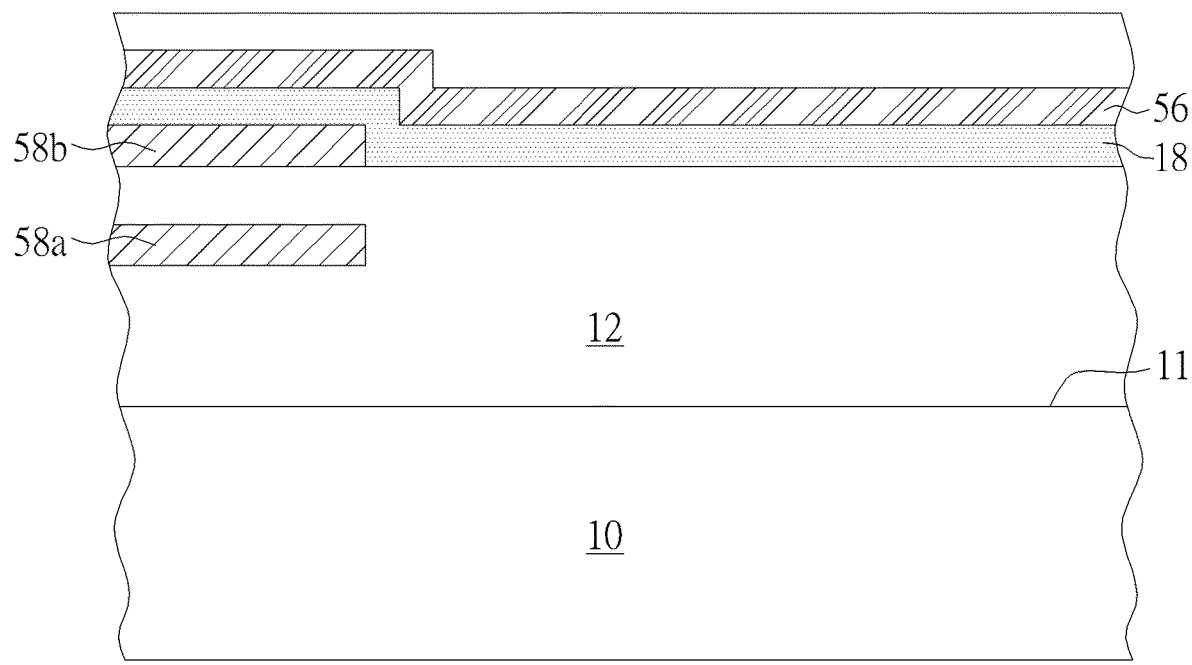
FIGS. 8-12 are cross-sectional views illustrating a method of forming a MEMS structure according to another embodiment of the present invention.

FIGS. 8-12 depict a method of forming a MEMS structure according to another embodiment of the present invention, in which an additional etch stop layer is formed. Referring to FIG. 8, a metal interconnect structure including a metal layers 58a and 58b, an inter-dielectric layer 12, and an etch stop layer 18 are formed in the same way as described above for the first embodiment, except that an additional dielectric layer 56 also serving as an etch stop layer is formed on the etch stop layer 18. The dielectric layer 56 may have a thickness of 1,000 to 3,000 angstroms. The etch stop layer 18 or the dielectric layer 56 or both may be allowed, as desired, to or not to extend onto one of metal layers of the metal structure within the inter-dielectric layer 12. As shown in FIG. 3, the etch stop layer 18 is disposed so as to extend onto the metal layer 58b and to cover at least a portion of the metal layer 58b, and the dielectric layer 56 is formed on the etch stop layer 18 and also covers at least a portion of the metal layer 58b.

Figure 9:
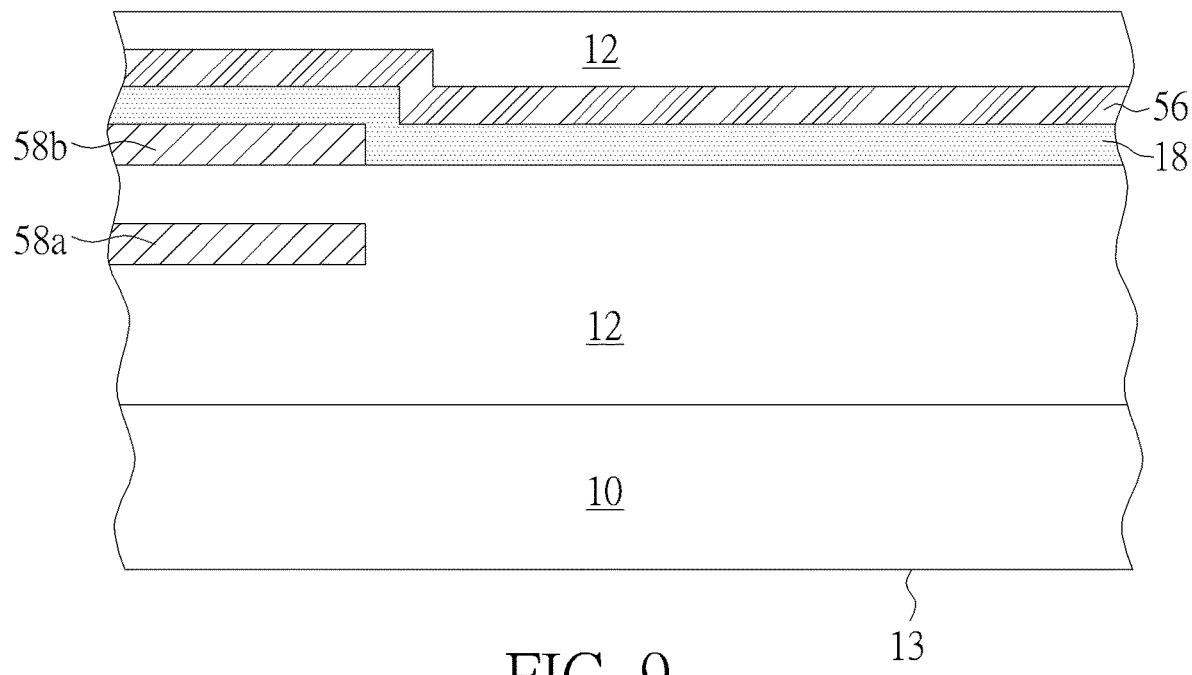

Thereafter, as shown in FIG. 9, the backside 13 of the substrate 10 is ground, and it may be in the same way as described above for the first embodiment.

Figure 10:
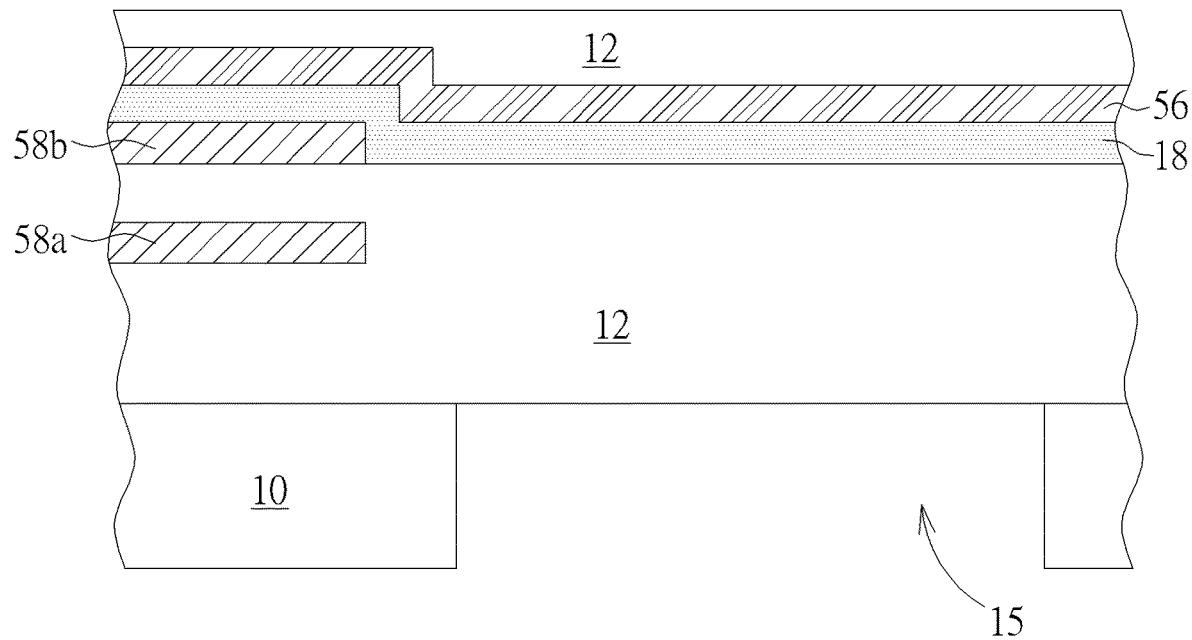
Figure 11:
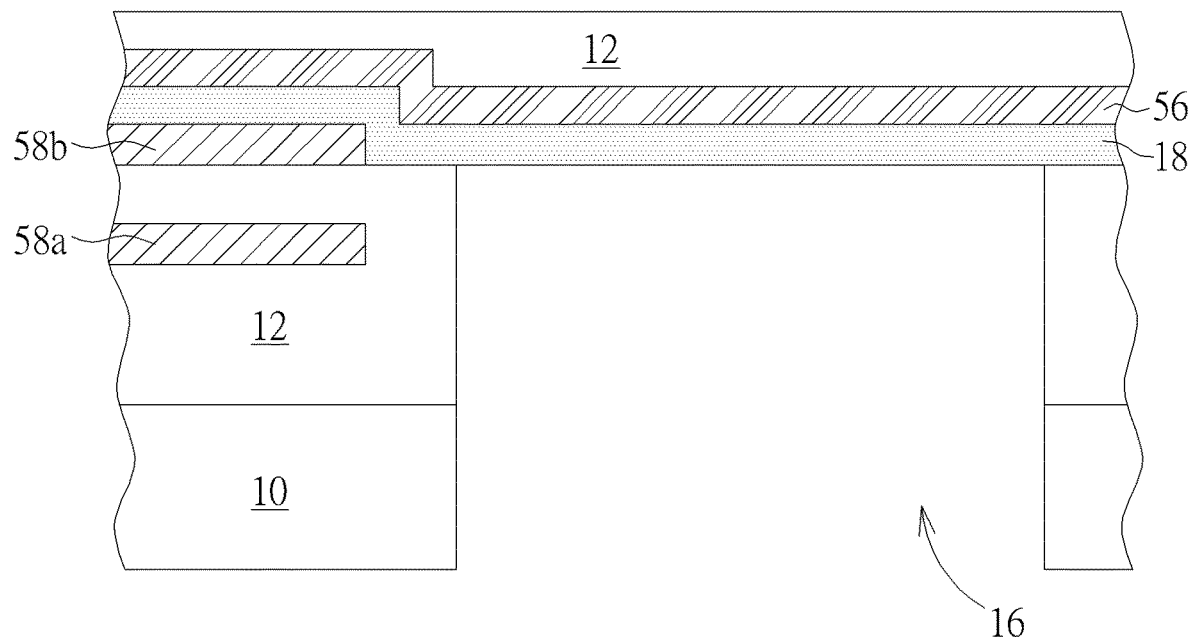

Thereafter, as shown in FIG. 10 and FIG. 11, the substrate 10 and the inter-dielectric layer 12 are etched, and it may be in the same way as described above for the first embodiment.

Figure 12:
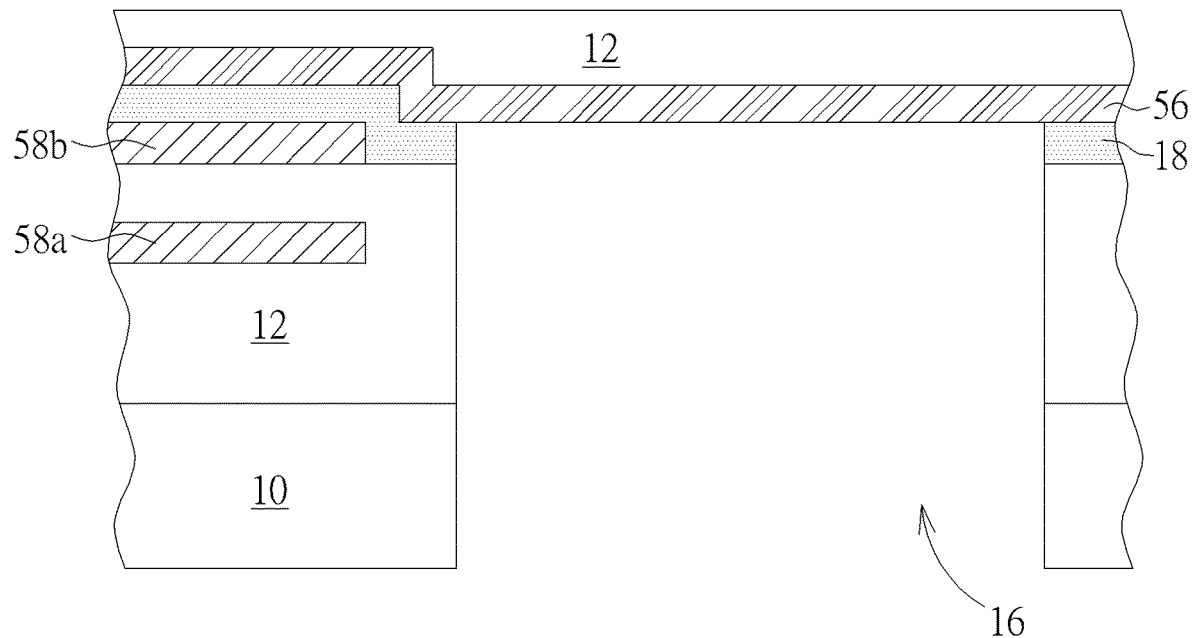

For a better MEMS device performance, the etch stop layer 18 may be further etched to be partially removed as shown in FIG. 12. The etch stop layer 18 is etch-selective to the dielectric layer 56 in the etch process. Accordingly, the dielectric layer 56 may protect the inter-dielectric layer 12 during the etch of the etch stop layer 18. For example, when the inter-dielectric layer 12 includes oxide, the etch stop layer 18 may include amorphous silicon or polysilicon, and the dielectric layer 56 may include SiN or SiC, but not be limited thereto.

A wet cleaning process may be further performed. The dielectric layer 56, i.e. the second etch stop layer, may protect the inter-dielectric layer 12 during the wet cleaning process.

Figure 13:
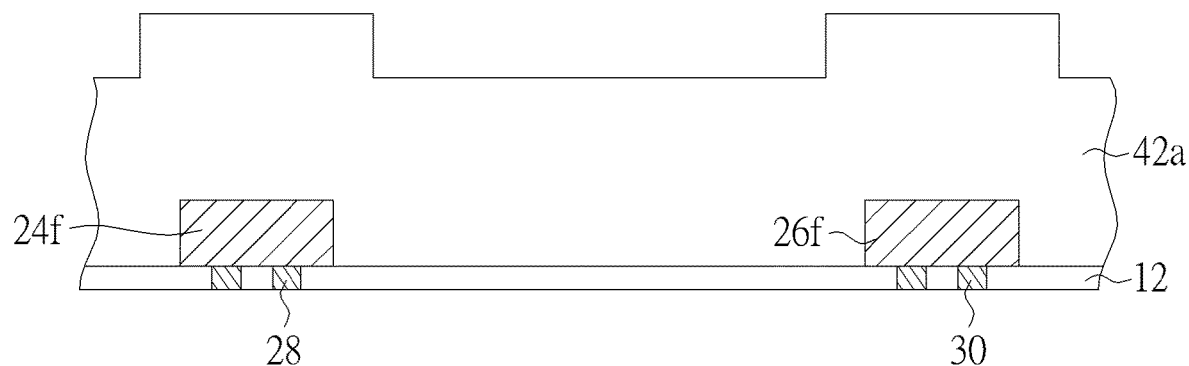
FIGS. 13-16 are cross-sectional views illustrating formation of a MEMS component according to an embodiment of the present invention.
Figure 14:
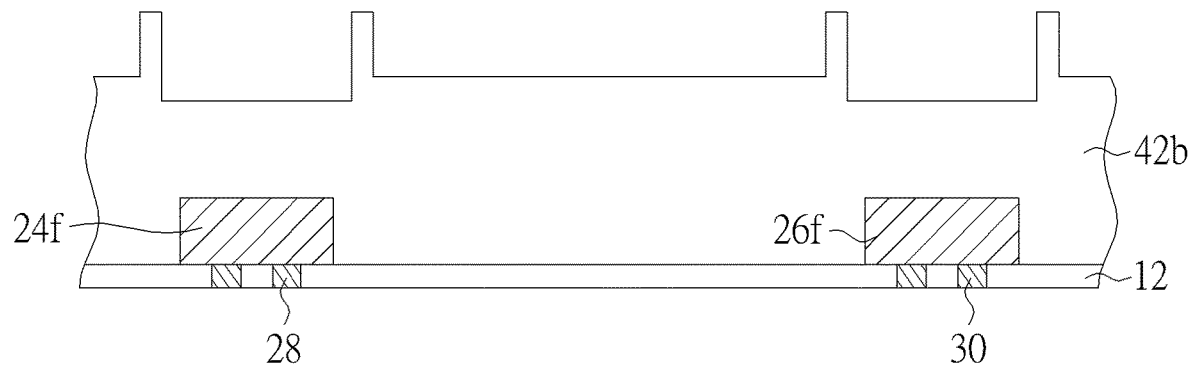
Figure 15:
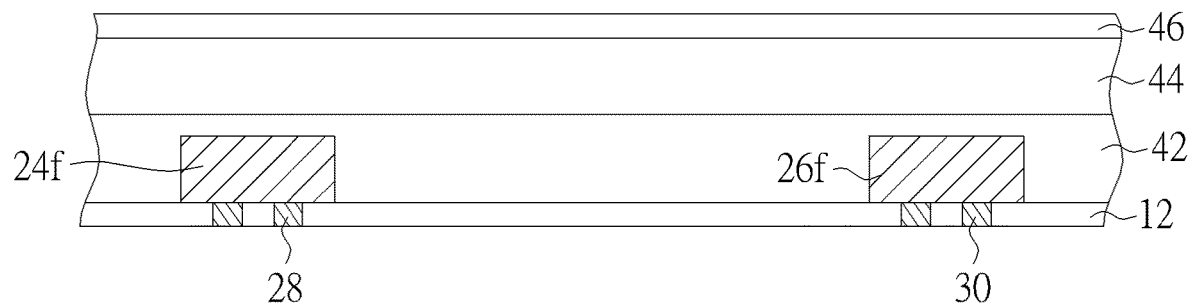

Furthermore, referring to FIGS. 13-16, the MEMS component as shown in FIGS. 1 and 2 may be fabricated for example as described below. After the top layers 24f and 26f, which may be Metal-6 with a thickness of about 9,000 angstroms of an metal interconnect structure, are formed, a dielectric layer 42 may be formed. It may be achieved by, for example, performing a CVD process using TEOS as a precursor for avoiding voids to form a silicon oxide layer 42a of a thickness of, for example, about 20,000 angstroms as shown in FIG. 13. Thereafter, a reverse-mask process is performed and the silicon oxide layer 42a is patterned corresponding to an underlying metal pattern to become a silicon oxide layer 42b, as shown in FIG. 14, which is thinner at positions above two top layers 24f and 26f. Regarding the silicon oxide layer 42b, the step high is reduced in comparison with the silicon oxide layer 42a, and "dishing" phenomenon can be avoided or mitigated for a subsequent CMP process.

Thereafter, the silicon oxide layer 42b is planarized using a CMP process to become about 12,000 angstroms. Thereafter, referring to FIG. 15, a dielectric layer 44 is formed on the dielectric layer 42. The dielectric layer 44 may be a stress tuned SiN layer with a thickness of, for example, about 10,000 angstroms formed by, for example, CVD process. Thereafter, a dielectric layer 46 is formed on the dielectric layer 44. The dielectric layer 44 may be a low-stressed silicon oxide layer of a thickness of about 4,000 angstroms formed by for example CVD process using TEOS as a precursor. Thereafter, an annealing process may be performed at a temperature of about 420° C. for about 20 minutes.

Figure 16:
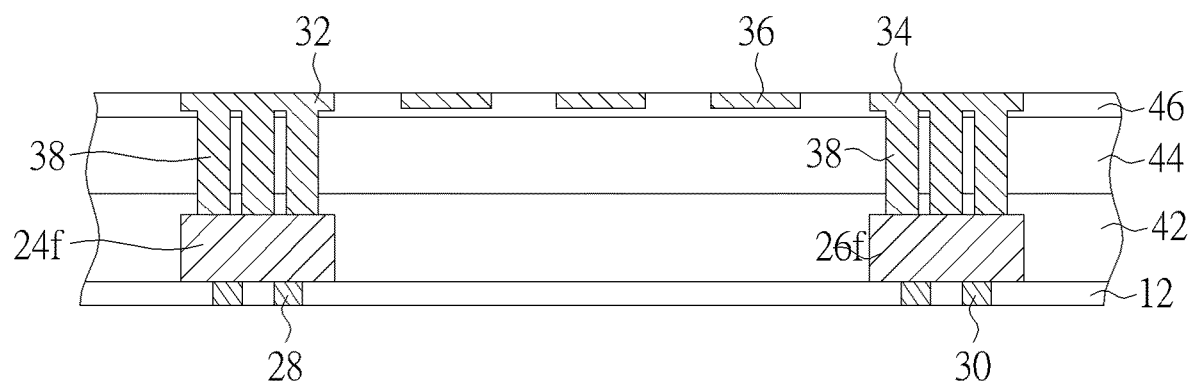

Thereafter, referring to FIG. 16, a plurality of trenches for metal pattern definition are formed by etching the dielectric layer 46 to a depth of about 1,500 angstroms to about 3000 angstroms. Thereafter, a plurality of via holes are formed through the remaining dielectric layer 46 and the dielectric layers 44 and 42 to expose the top layers 24f and 26f. Thereafter, tungsten is deposited to fill the vias and the trenches and extend onto the dielectric layer 46 to have a thickness greater than the etching depth for forming the trenches in the previous process. Thereafter, the tungsten layer is planarized by a CMP process to form metal layers 32 and 34 and a plurality of metal layers 36.

Thereafter, referring to FIG. 1, a dielectric layer 48 is formed to cover the metal layers 32, 34 and 36. The dielectric layer 48 may be a low-stressed HDP oxide layer with a thickness of about 6,000 angstroms by performing a high density plasma CVD process. Thereafter, an annealing process may be performed at a temperature of about 400° C. to about 450° C. for about 1 minute. Thereafter, the dielectric layer 48 is etched to form an opening exposing the metal layer 34. The opening may have a tapper shape. The metal layer 34 may serve as a pad. Thereafter, a barrier layer 50 may be optionally formed on the dielectric layer 48 and the metal layer 34. The barrier layer 50 may be formed for example using an in-situ sputter deposition process to form a TaN layer, but not limited thereto, with a thickness of about 400 angstroms. Thereafter, a metal layer 52 is formed on the barrier layer 50 and patterned. The metal layer 52 may be a platinum layer, but not limited thereto, with a thickness of about 1,000 angstroms formed by an in-situ sputtering deposition process. Thereafter, the metal layer 52 is patterned by etch through a patterned photoresist layer to form electrodes. Thereafter, a dielectric layer 54 is formed to cover the metal layer 52 and the dielectric layer 48. The dielectric layer 54 may be a stress-tuned SiN layer which is slightly compressive. Thereafter, an annealing process may be performed at a temperature of about 400° C. to about 450° C. for about 1 minute. Thereafter, openings serving as sensor windows are formed by an etch process performed on the dielectric layer 54 for exposing desired electrodes. The obtained MEMS component may serve for a flow meter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MEMS structure, comprising:
a substrate;
an inter-dielectric layer on a front side of the substrate;
a MEMS component on the inter-dielectric layer;
a chamber disposed within the inter-dielectric layer and through the substrate and having an opening at a backside of the substrate;
a first etch stop layer disposed within the inter-dielectric layer, wherein the chamber has a ceiling opposite to the opening and a sidewall joining the ceiling, a surface of the first etch stop layer is even with the ceiling, no first etch stop layer is on the ceiling, and the sidewall comprises a portion of the first etch stop layer; and
a second etch stop layer disposed on the first etch stop layer, wherein the second etch stop layer comprises silicon nitride or silicon carbide.

2. The MEMS structure according to claim 1, wherein, an etch selectivity of the first etch stop layer to the second etch stop layer is greater than 1.

3. The MEMS structure according to claim 1, wherein, the first etch stop layer comprises silicon.

4. The MEMS structure according to claim 1, wherein, the first etch stop layer comprises amorphous silicon or polysilicon.

5. The MEMS structure according to claim 1, wherein, the second etch stop layer serves as a ceiling of the chamber.

6. The MEMS structure according to claim 1, further comprising a metal structure in the inter-dielectric layer, wherein, the metal interconnect structure comprises a top metal layer, a bottom metal layer and a metal layer between the top metal layer and the bottom metal layer, and the first etch stop layer is formed to extend onto the metal layer.

7. The MEMS structure according to claim 1, further comprising a metal interconnect structure in the inter-dielectric layer, wherein, the metal structure comprises a first metal layer, a second metal layer, a third metal layer, a fourth metal layer, a fifth metal layer and a sixth metal layer in the order from bottom to top, and the first etch stop layer is formed to extend onto the third or fourth metal layer.

* * * * *